(12) United States Patent
Cabral, Jr. et al.

(10) Patent No.: US 8,492,897 B2
(45) Date of Patent: Jul. 23, 2013

(54) MICROSTRUCTURE MODIFICATION IN COPPER INTERCONNECT STRUCTURES

(75) Inventors: Cyril Cabral, Jr., Mahopac, NY (US); Jeffrey P. Gambino, Essex Junction, VT (US); Qiang Huang, Croton-on-Hudson, NY (US); Takeshi Nogami, Schenectady, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 13/232,085

(22) Filed: Sep. 14, 2011

(65) Prior Publication Data

US 2013/0062769 A1    Mar. 14, 2013

(51) Int. Cl.
    H01L 23/48    (2006.01)
(52) U.S. Cl.
    USPC .......................................................... 257/751
(58) Field of Classification Search
    USPC .................................................. 257/750, 751
    See application file for complete search history.

(56) References Cited

U.S. PATENT DOCUMENTS

| | | | |
|---|---|---|---|
| 6,417,571 B1 | 7/2002 | Nogami et al. | |
| 7,452,812 B2 | 11/2008 | Beyer et al. | |
| 7,611,984 B2 | 11/2009 | Koura et al. | |
| 7,718,524 B2 | 5/2010 | Ooka | |
| 7,755,194 B1 | 7/2010 | Marathe et al. | |
| 7,843,063 B2 | 11/2010 | Baker-O'Neal et al. | |
| 7,847,405 B2 | 12/2010 | Watanabe et al. | |
| 7,863,194 B2 | 1/2011 | Yin et al. | |
| 7,888,253 B2 | 2/2011 | Usui et al. | |
| 7,902,061 B2 | 3/2011 | Clevenger et al. | |
| 2006/0251800 A1 | 11/2006 | Weidman et al. | |
| 2009/0121355 A1* | 5/2009 | Haneda et al. | 257/751 |
| 2009/0206484 A1 | 8/2009 | Baker-O'Neal et al. | |
| 2009/0321935 A1 | 12/2009 | O'Brien et al. | |
| 2010/0009530 A1 | 1/2010 | Haneda et al. | |
| 2010/0013096 A1 | 1/2010 | Irumata et al. | |
| 2011/0049705 A1 | 3/2011 | Liu et al. | |
| 2011/0254164 A1* | 10/2011 | Gordon et al. | 257/751 |

OTHER PUBLICATIONS

Yeung Au et al.,"Filling Narrow Trenches", Journal of the Electrochemical Society, Mar. 17, 2011, 158 (5) D248-D253 (2011), The Electrochemical Society.
Jeffrey P. Gambino, "Improved Reliability of Copper Interconnects using Alloying", 978-1-4244-5598-0/10/ © 2010 IEEE, IPFA 2010.
Annabelle Pratt, "Overview of the Use of Copper Interconnects in the Semiconductor Industry", 2004, Advanced Energy Industries Inc, white paper.

(Continued)

Primary Examiner — Bradley K Smith
(74) Attorney, Agent, or Firm — Catherine Ivers

(57) ABSTRACT

A metal interconnect structure and a method of manufacturing the metal interconnect structure. Manganese (Mn) is incorporated into a copper (Cu) interconnect structure in order to modify the microstructure to achieve bamboo-style grain boundaries in sub-90 nm technologies. Preferably, bamboo grains are separated at distances less than the "Blech" length so that copper (Cu) diffusion through grain boundaries is avoided. The added Mn also triggers the growth of Cu grains down to the bottom surface of the metal line so that a true bamboo microstructure reaching to the bottom surface is formed and the Cu diffusion mechanism along grain boundaries oriented along the length of the metal line is eliminated.

10 Claims, 8 Drawing Sheets

OTHER PUBLICATIONS

J. Koike et al., "Self-forming Diffusion Barrier Layer in Cu-Mn Alloy Metallization", Appl. Phys. Lett. 87, 041911, Jul. 22, 2005.

J. Iijima et al., "Growth Behavior of Self-formed Barrier Using Cu-Mn Alloys at 350 to 600 C", Proc. of IITC, (2006), 246.

T. Wantanabe et al., "Self-formed Barier Technology using CuMn Alloy Seed for Copper Dual-Damascene Interconnect", Proc. of IITC, (2007), 7.

M. Haneda et al., "Growth Behavior of Self-formed Barrier at Cu-Mn/SiO2 Interface", Appl. Phys. Lett., Proc. of AMC (2207), 59, Jun. 19, 2007.

International Application No. PCT/US2012/047106 International Filing Date: Jul. 18, 2012 International Search Report and Written Opinion.

* cited by examiner

MICROSTRUCTURE MODIFICATION IN COPPER INTERCONNECT STRUCTURES

BACKGROUND OF THE INVENTION

1. Field of the Invention

The present invention relates to semiconductor structures. More particularly, the present invention relates to metal interconnect structures having large grain sizes at a bottom of a metal interconnect line and methods of manufacturing the same.

2. Description of the Related Art

Current sub-90 nm copper interconnect technology has a non-bamboo microstructure, that is, a microstructure without bamboo-like features in lines and vias. The non-bamboo microstructure leads to concerns associated with copper diffusion such as electromigration and stress voiding.

There are currently three different modes of copper diffusion. One mode is copper diffusion along grain boundaries of a copper interconnect structure. Another mode is copper diffusion at a surface of a copper interconnect structure, that is, at an interface at which the copper interconnect structure adjoins another material. An alternate mode is copper bulk diffusion through grains, that is, across an interface at which two grain boundaries meet. Typically, the rate of diffusion is higher for copper diffusion along grain boundaries and lower for copper bulk diffusion through grains. Thus, it is optimal to form a copper interconnect structure containing a metal line in which the metal line has a bamboo-like pattern in the grain microstructure, or a "bamboo microstructure." In a bamboo microstructure, the lateral width of a grain is the same as the width of the metal line or the metal via. The length of the grain is greater than the width of the metal line so that grain boundaries look like a stalk of a bamboo plant with notched segmentation.

It is optimal to have a bamboo microstructure where grains span the width and height of a line or via. The phenomenon of electromigration occurs when a current flowing in the line, due to an externally applied field, leads to a net drift of copper (Cu) ions in the direction of the electron flow. The drift eventually will lead to line failure due to loss of copper at divergent sites such as grain boundaries and material interfaces. Because electrical current flows along the direction of a metal line and any electromigration is forced to occur "through," that is, substantially perpendicular to the plane of grain boundaries, the bamboo microstructure offers significantly more resistance to electromigration than non-bamboo microstructures. The bamboo microstructure essentially shuts down diffusion along grain boundaries, because bamboo grain boundaries are substantially at right angles to the current flow.

An alternative way of suppressing electromigration in a metal interconnect structure exists. If the length of a metal line is less than the "Blech" length, copper ion motion will not occur, shutting down the electromigration process. Mechanical stress at lengths less than the "Blech" length opposes the drift of copper ions. A typical Blech length is 10 microns for current interconnect structures consisting of copper. In principle, designing all interconnect metal lines shorter than the "Blech" length would solve the problem. In practice, such a limitation puts a severe constraint on the design and layout of an interconnect structure, and practically renders such layouts impractical.

In a related patent, U.S. Pat. No. 7,843,063, commonly assigned, it is disclosed that cobalt (Co) has a similar property, promoting normal grain growth (growth of all orientations simultaneously) or abnormal grain growth (growth of certain orientations preferential to others) in the fine lines and vias leading to bamboo grains (spanning the line width and height). Although, cobalt (Co) and manganese (Mn) have similar properties, Mn has a better optimal percentage over the use of Co.

The use of Cu-Mn seed layers has been contemplated in order to form "self-forming" diffusion barriers. The Mn is placed in the Cu seed layer and after thermal treatment diffuses to interfaces reacting with oxygen (O) to form manganese oxide (MnO) and possibly manganese silicate (MnSiO) layers. These layers at the dielectric-copper (Cu) interface or barrier-copper (Cu) interface act as diffusion barriers. Some publications that describe the use of MnO as a diffusion barrier are:

J. Koike et al., Appl. Phys. Lett. 87, (2005), 041911; J. Iijima et al., Proc. of IITC, (2006), 246;

T. Watanabe et al., Proc. of IITC, (2007), 7; M. Haneda et al., Proc. of AMC (2207), 59.

Suppressing copper diffusion without resorting to use of a design rule stipulating that all metal interconnect lines be shorter than the "Blech" length is needed. Thus, there exists a need for metal interconnect structures having fine feature sizes such as sub-90 nm metal lines, i.e. metal lines having a width less than 90 nm, and containing bamboo microstructures so that copper diffusion and associated complications can be avoided. A bamboo grain, one spanning the width and height of an interconnect or via, every "Blech" length (10 μm), will substantially stop electromigration along grain boundaries.

SUMMARY OF THE INVENTION

The present invention incorporates manganese into a copper interconnect structure in order to modify the microstructure to achieve bamboo-style grain boundaries in sub-90 nm technologies.

According to an embodiment of the present invention, a metal interconnect structure is provided. The metal interconnect structure includes: a dielectric material layer containing a recessed line pattern; a metallic barrier layer abutting the dielectric material layer at sidewalls of the recessed line pattern and overlying an entirety of the dielectric material layer; a copper-containing seed layer abutting the metallic barrier layer and overlying an entirety of the dielectric material layer; and a copper-containing layer including electroplated copper and abutting the copper-containing seed layer, wherein at least one of the copper-containing seed layer and the copper-containing layer includes a copper-manganese alloy, and wherein the copper-containing seed layer and the copper-containing layer form a bamboo grain within the recessed line pattern, the grain size measured at a bottom surface of the copper-containing layer exceeding a width of the copper-manganese alloy line at least every "Blech" length.

According to a further embodiment of the present invention, another metal interconnect structure is provided. The metal interconnect structure includes: a dielectric material layer containing a recessed line pattern; a metallic barrier layer abutting the dielectric material layer at sidewalls of the recessed line pattern and overlying an entirety of the dielectric material layer; a copper-containing seed layer abutting the metallic barrier layer and overlying an entirety of the dielectric material layer; a copper-containing layer including electroplated copper and abutting the copper-containing seed layer, wherein the copper-containing seed layer and the copper-containing layer form a bamboo grain within the recessed line pattern, the grain size measured at a bottom surface of the copper-containing layer exceeding a width of the copper-manganese alloy line at least every "Blech" length; and a copper-manganese alloy cap layer abutting the copper-containing layer.

According to another embodiment of the present invention, a further metal interconnect structure is provided. The metal interconnect structure includes: a plated copper layer containing a line pattern; a copper-manganese seed layer having an atomic concentration of manganese from about 1 ppm to about 20 atomic percent at the bottom surface of the plated copper line sandwiched between the plated copper line and a barrier layer all of which are patterned, wherein a grain size measured at a bottom of the copper-manganese alloy line exceeds a width of the copper-manganese alloy line at least every "Blech" length; and a barrier and dielectric layer surrounding the copper manganese alloy line.

According to a further embodiment of the present invention, a method of forming a metal interconnect structure is provided. The method includes: providing a dielectric material layer containing a recessed line pattern; forming a metallic barrier layer on the dielectric material layer at sidewalls of the recessed line pattern; forming a copper-containing seed layer on the metallic barrier layer; and electroplating a copper-containing layer on the copper-containing seed layer, wherein at least one of the copper-containing seed layer and the copper-containing layer includes a copper-manganese alloy containing a manganese concentration from about 1 ppm to about 10 atomic percent.

According to another embodiment of the present invention, a further method of forming a metal interconnect structure is provided. The method includes: providing a dielectric material layer containing a recessed line pattern; forming a metallic barrier layer directly on the dielectric material layer at sidewalls of the recessed line pattern; forming a copper-containing seed layer directly on the metallic barrier layer; electroplating a copper-containing layer directly on the copper-containing seed layer; and forming a copper-manganese alloy cap layer containing a manganese concentration from about 1 ppm to about 50 atomic percent directly on the copper-containing layer.

BRIEF DESCRIPTION OF THE DRAWINGS

The features and elements of the present invention are set forth with respect to the appended claims and illustrated in the drawings.

DETAILED DESCRIPTION OF THE PREFERRED EMBODIMENTS

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present invention incorporates manganese (Mn) into a copper (Cu) interconnect structure in order to modify the microstructure to achieve bamboo-style grain boundaries in sub-90 nm technologies. Preferably, bamboo grains are separated at distances less than the "Blech" length so that copper (Cu) diffusion through grain boundaries is avoided. The manganese (Mn) can be incorporated into a copper (Cu) seed layer to be formed under a metal line, as a capping layer to be formed over a metal line, or during a plating process Annealing the copper (Cu) interconnect structure at room temperature or above induces grain growth (recrystallization) at a faster rate when Mn is added to a Cu seed layer. The added Mn also triggers the growth of Cu grains down to the bottom surface of the metal line so that a true bamboo microstructure reaching to the bottom surface is formed and the Cu diffusion mechanism along grain boundaries oriented along the length of the metal line is eliminated.

Manganese (Mn) is added to the copper (Cu) seed layer, the copper (Cu) plating layer or the copper (Cu) capping layer in order to modify the microstructure of copper (Cu) lines and vias. The manganese (Mn) can be in the form of a copper manganese alloy or as a very thin manganese (Mn) layer. The manganese (Mn) can promote normal grain growth (growth of all orientations simultaneously) or abnormal grain growth (growth of certain orientations preferential to others) in the fine lines and vias leading to bamboo grains (spanning the line width and height). Tailored to occur at a distance less than the "Blech" length, the grain boundaries configured in bamboo microstructure in the inventive metal interconnect structure shut down copper (Cu) grain boundary diffusion. At least one bamboo grain (at right angles to the current flow) every "Blech" length acts as a blocking site for copper (Cu) diffusion. The composition of the metal interconnect structure after grain growth contains from about 1 ppm to about 10% of manganese (Mn) in atomic concentration.

Figure 1:
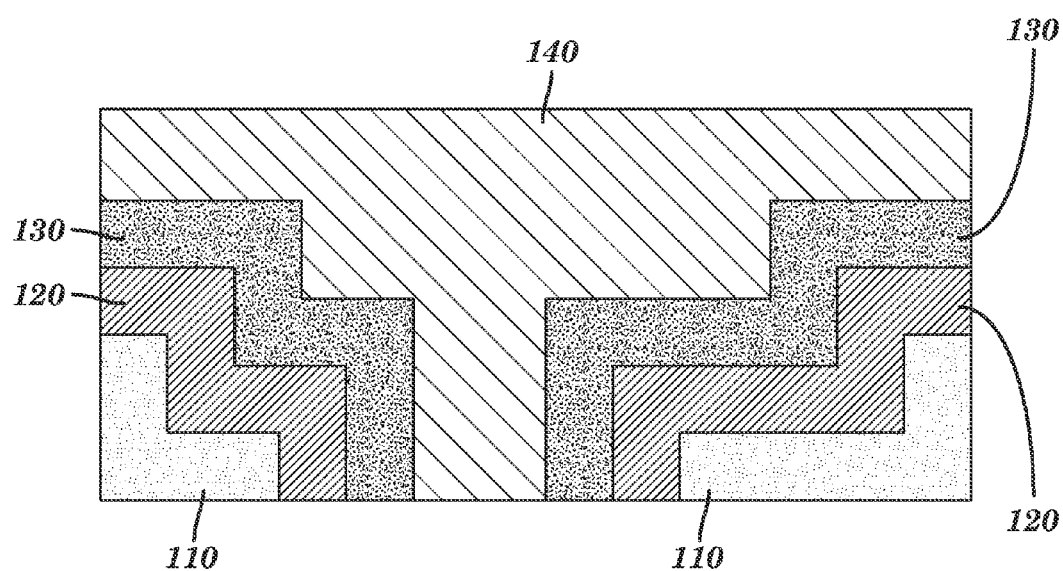
FIG. 1 illustrates a schematic cross section of a first embodiment of the metal interconnect structure of the present invention.

Referring to FIG. 1, a metal interconnect structure according to a first embodiment of the present invention includes a dielectric layer 110, a metallic barrier layer 120, a copper-manganese alloy seed layer 130, and a plated copper-containing layer 140. The dielectric layer 110 is typically formed on a semiconductor substrate (not shown) containing semiconductor devices (not shown). The dielectric layer 110 includes a dielectric material such as silicon oxide (SiO), silicon nitride (SiN), organosilicate glass (OSG), SiCOH, a spin-on low-k dielectric material such as SiLK™, etc. The dielectric layer 110 may be porous or non-porous. A via cavity overlaps with the line cavity in an integration scheme that is known in the art as dual damascene integration scheme.

For illustrative purposes, the present invention is described for a dual damascene integration scheme. However, variations of the present invention in a single damascene integration scheme are contemplated, in which the metal vias and metal lines are formed by two separated electroplating processes. In the event a single damascene integration scheme is used, the methods of the present invention are preferably repeated twice, a first time, to form the metal vias containing a copper-manganese alloy and having a single grain or large grains with boundaries running perpendicular to the via (parallel to the substrate), and a second time, to form metal lines containing a copper-manganese alloy having the same bamboo structure as the bamboo structure to be described below for the dual damascene integration scheme.

The metallic barrier layer 120 is formed to prevent diffusion of contaminants from and/or into a metal via and a metal line to be subsequently formed, as well as to promote adhesion of the metal via and the metal line to the dielectric layer 110. The metallic barrier layer 120 may include Ta, TaN, W, WN, TiN, or a stack thereof such as Ta/TaN, Ta/TaN/Ta, TaN/Ta, etc. The metallic barrier layer 120 may be formed by chemical vapor deposition (CVD), physical vapor deposition (PVD), atomic layer deposition (ALD), etc. The thickness of metallic barrier layer 120, as measured at a bottom surface of the line cavity, ranges from about 1 nm to about 25 nm, and typically from about 3 nm to about 10 nm, although lesser and greater thicknesses are also contemplated herein.

The copper-manganese alloy seed layer 130 is formed on the metallic barrier layer 120, for example by physical vapor deposition (PVD), chemical vapor deposition, atomic layer deposition (ALD), electrodeposition, or electroless deposition. The copper-manganese alloy seed layer 130 is a copper-containing seed layer, which also includes manganese, i.e., includes an alloy of copper and manganese. The concentration of manganese in the copper-manganese alloy seed layer 130 may be from about 1 ppm to 10 atomic percent and preferably from about 10 ppm to about 2 atomic percent. Incorporation of manganese into the copper-manganese alloy 130 may be effected, for example, by replacing pure copper in a sputtering target of a PVD process with a target containing a copper-manganese alloy.

The copper-manganese alloy seed layer 130, as deposited, has a polycrystalline structure in which the average size of the grains is comparable with the thickness of the copper-manganese alloy seed layer 130 or less. Typically, the copper-manganese alloy seed layer 130 has an average grain size from about 2 nm to about 10 nm. The thickness of the copper-manganese alloy seed layer 130, as measured above a bottom surface of the line cavity, may be from about 2 nm to about 60 nm and typically from about 5 nm to about 50 nm, although lesser and greater thicknesses are also contemplated herein.

The plated copper-containing layer 140 is formed by plating a copper-containing material on the copper-manganese alloy seed layer 130. The plating process may employ electroplating or electroless plating. The plated copper-containing layer 140, due to the nature of the process employed for formation, i.e., due to the nature of the plating process, includes O, N, C, Cl, and S. The sum of concentrations of O, N, C, Cl, and S is typically from about 1 ppm to about 200 ppm. Preferably, the plated copper-containing layer 140 is formed by electroplating. Typically, a superfill (bottom-up fill) process is employed to prevent formation of any seam within the via cavity or the line cavity so that the plated copper-containing layer 140 is free of any cavity therein.

The plated copper-containing layer 140 may, or may not, include manganese. In one case, the plated copper-containing layer 140 may consist essentially of copper, so that any material other than copper in the plated copper-containing layer 140 is at a trace level. In another case, the plated copper-containing layer 140 may include a copper-manganese alloy with a manganese concentration from about 1 ppm to 10 atomic percent, and preferably from about 10 ppm to about 2 atomic percent. Incorporation of manganese into the plated copper-containing layer 140 may be effected by replacing a plating bath containing a solution of a copper-manganese alloy, i.e., adding manganese to the plating bath so that manganese is incorporated into the film during plating.

The thickness of the plated copper-containing layer 140, as measured outside the area containing the via cavity and the line cavity prior to the filling thereof by the plated copper-containing layer 140, may be from about 40 nm to about 800 nm, and typically from about 100 nm to about 300 nm, although lesser and greater thicknesses are contemplated herein also. As deposited, the plated copper-containing layer 140 has a microstructure in which the grain size is from about 5 nm to about 400 nm, and typically from about 10 nm to about 200 nm, although the grain size depends on the details of the plating process and may be less than or greater than the range indicated above.

The first exemplary metal interconnect structure is subjected to a recrystallization process in which the grains in the copper-manganese alloy seed layer 130 and the plated copper-containing layer 140 grow. The recrystallization process typically employs an anneal at a temperature from about 20° C. to about 400° C. for a time period from about 1 second to about 1 week. The grain size increases during the annealing within the copper-manganese alloy seed layer 130 and the plated copper-containing layer 140. While an anneal above 50° C. is preferred, some degree of recrystallization occurs at room temperature so that the present invention may be advantageously employed even without an anneal process, i.e., by leaving the first exemplary metal interconnect structure alone at room temperature from an extended time, and thereby increasing the size of the grains.

The manganese added into copper-manganese alloy seed layer 130 affects the microstructure of a copper-manganese alloy layer, which is formed by the recrystallization of the copper-manganese alloy seed layer 130 and the plated copper-containing layer 140, after the recrystallization process. Manganese forms no intermetallic compounds with copper. Thus, manganese precipitates in the grain boundaries during the recrystallization process. Manganese also induces growth of large grains even at the interface with the metallic barrier layer 120 such that the size of the grains is substantially the same at the top of the copper-manganese alloy layer as at the bottom of the copper-manganese alloy layer.

According to the present invention, manganese in the copper-manganese alloy seed layer 130 nucleates new grains in the plated copper-containing layer 140 so that the grains in the plated copper-containing layer 140 may grow to dimensions larger than the feature size of metal lines to be subsequently formed. Further, grain growth extends into the copper-manganese alloy seed layer 130 so that the entirety of the copper-manganese alloy layer is affected by the grain growth. In addition, the plated copper-containing layer 140 may optionally supply additional manganese to accelerate the grain growth during the recrystallization process.

The copper-manganese alloy layer, which has been through the recrystallization process, has grain sizes larger than the thickness as measured over a line feature area of the copper-manganese alloy layer to the top surface of the dielectric layer 110. The bottom portion of the copper-manganese alloy layer, including the portions corresponding to the via cavity and the line cavity prior to formation of the copper-manganese alloy seed layer 130, in the first exemplary metal interconnect structure contains substantially few small grains. The grain size of the bottom portion of the copper-manganese alloy layer is substantially the same as the grain size of the top portion of the copper-manganese alloy layer, and is thus greater than the thickness of the copper-manganese alloy layer. The absence of a network of small size grains at the bottom portion of the copper-manganese alloy layer prevents diffusion of copper atoms or manganese atoms along a grain boundary. Grain boundaries that are present within a recessed line feature tend to run in the direction of the width of the recessed line feature. Thus, the grain boundaries in the copper-manganese alloy layer substantially do not join one another, and the copper-manganese alloy layer has a bamboo microstructure in which grain boundaries within the bamboo microstructure extend to a bottom surface of copper-manganese alloy layer and separated from one another by at least one grain. A bamboo grain every "Blech" length substantially stops electromigration induced by grain boundary diffusion.

The copper-manganese alloy layer is planarized, for example, by chemical mechanical planarization, to form a copper-manganese alloy line that is substantially coplanar with a top surface of the dielectric layer 110. The grain size near the top surface of the copper-manganese alloy line may be about, or greater than, 2 to 3 times the width of the copper-manganese alloy line. Thus, the copper-manganese alloy line substantially has a bamboo microstructure throughout and is free of small grains having a size less than the width of the copper-manganese alloy line. The bamboo-style segmentation between grain boundaries is substantially present throughout the entirety of the copper-manganese alloy line. The bamboo microstructure eliminates copper diffusion along grain boundaries since any remaining grain boundaries are substantially perpendicular to the direction of current flow.

Figure 2:
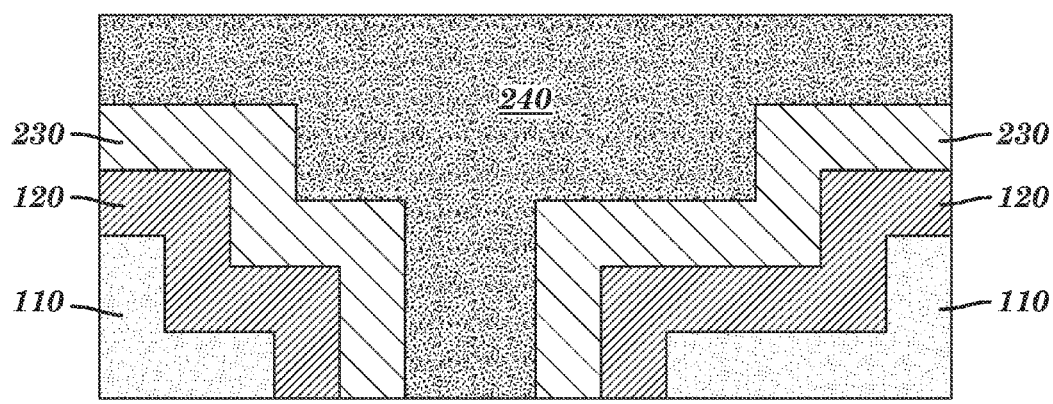
FIG. 2 illustrates a schematic cross section of a second embodiment of the metal interconnect structure of the present invention.

Referring to FIG. 2, a second exemplary metal interconnect structure according to a second embodiment of the present invention includes a dielectric layer 110, a metallic barrier layer 120, a copper-containing seed layer 230, and a plated copper-manganese alloy layer 240. The dielectric layer 110 is typically formed on a semiconductor substrate (not shown) containing semiconductor devices (not shown) and may include the same materials as in the first embodiment. A via cavity and a line cavity are formed within the dielectric layer 110 by lithographic patterning and etching such that the via cavity overlaps with the line cavity in an integration scheme that is known in the art as a dual damascene integration scheme. The metallic barrier layer 120 is formed in the same manner as, and has the same composition and thickness as in the first embodiment.

The copper-containing seed layer 230 is formed on the metallic barrier layer 120, for example, by physical vapor deposition (PVD), chemical vapor deposition (CVD), atomic layer deposition (ALD), electrodeposition or electroless deposition. The copper-containing seed layer 230 may, or may not, include manganese. In one case, the copper-containing seed layer 230 may consist essentially of copper, so that any material other than copper in the copper-containing seed layer 230 is at a trace level. In another case, the copper-containing seed layer 230 may include a copper-manganese alloy with a manganese concentration from about 1 ppm to 10 atomic percent and preferably from about 10 ppm to about 2 atomic percent. Incorporation of manganese into the copper-containing seed layer 230 may be effected, for example, by replacing pure copper in a sputtering target of a PVD process with a target containing copper-manganese alloy.

The copper-containing seed layer 230, as deposited, has a polycrystalline structure in which the average size of the grains is comparable with the thickness of the copper-containing seed layer 230 or less. Typically, the copper-containing seed layer 230 has an average grain size from about 2 nm to about 10 nm. The thickness of the copper-containing seed layer 230, as measured above a bottom surface of the line cavity, may be from about 2 nm to about 60 nm, and typically from about 5 nm to about 50 nm, although lesser and greater thicknesses are also contemplated herein.

The plated copper-manganese alloy layer 240 is formed by plating a copper-manganese alloy on the copper-containing seed layer 230. The plating process may employ electroplating or electroless plating. The plated copper-manganese alloy layer 240, due to the nature of the process employed for formation, i.e., due to the nature of the plating process, includes O, N, C, Cl and S. The sum of concentrations of O, N, C, Cl and S is typically from about 1 ppm to about 200 ppm. Preferably, the plated copper-manganese alloy layer 240 is formed by electroplating. Typically, a superfill (bottom-up fill) process is employed to prevent formation of any seam within the via cavity or the line cavity so that the plated copper-manganese alloy layer 240 is free of any cavity therein.

The plated copper-manganese alloy layer 240 is a copper containing layer which also includes manganese, that is, includes an alloy of copper and manganese. Not necessarily but preferably, metallic components of the plated copper-manganese alloy layer 240 may consist of copper and manganese. The concentration of manganese in the plated copper-manganese alloy layer 240 may be from about 1 ppm to about 10 atomic percent, and preferably from about 10 ppm to about 2 atomic percent. Incorporation of manganese into the plated copper-manganese alloy layer 240 may be effected, for example, by replacing a plating bath containing a solution of pure copper with plating bath containing a solution of copper-manganese alloy, that is, adding manganese to the plating bath so that manganese is incorporated into the film during plating.

The thickness of the plated copper-manganese alloy layer 240, as measured outside the area containing the via cavity and the line cavity prior to the filling thereof by the plated copper-containing layer, may be from about 40 nm to about 800 nm, and typically from about 100 nm to about 300 nm, although lesser and greater thicknesses are contemplated herein also. As deposited, the plated copper-manganese alloy layer 240 has a microstructure in which the grain size is from about 5 nm to about 400 nm, and typically from about 10 nm to about 200 nm, although the grain size depends on the details of the plating process and may be less than or greater than the range indicated above.

The second exemplary metal interconnect structure is subjected to a recrystallization process in which the grains in the copper-containing seed layer 230 and the plated copper-manganese alloy layer 240 grow. After the recrystallization process, the second exemplary metal interconnect structure is substantially the same as the first exemplary metal interconnect structure of FIG. 1 of the first embodiment. The copper-containing seed layer 230 and the plated copper-manganese alloy layer 240 constitute a copper-manganese alloy layer. The same kind of recrystallization process may be employed as in the first embodiment, and the grain size increases in the same manner as in the first embodiment. The manganese added into plated copper-manganese alloy layer 240 affects the microstructure of a copper-manganese alloy layer, which is formed by the recrystallization of the copper-containing seed layer 230 and the plated copper-manganese alloy layer 240. Manganese precipitates in the grain boundaries during the recrystallization process in the same manner as in the first embodiment. Manganese induces growth of large grains even at the interface with the metallic barrier layer 220 such that the size of the grains is substantially the same at the top of a copper-manganese alloy layer, which is substantially the same as the copper-manganese alloy layer, 140 in FIG. 1, as the bottom of the copper-manganese alloy layer.

The second exemplary metal interconnect structure is substantially the same as the first exemplary metal interconnect structure as shown in FIG. 1. The copper-manganese alloy layer is planarized in the same manner as in the first embodiment to form a copper-manganese alloy line. The second exemplary metal interconnect structure at this point is substantially the same as the first exemplary metal interconnect structure in FIG. 1. The second exemplary metal interconnect structure includes the copper-manganese alloy line, which substantially has a bamboo microstructure, and is free of a network of small grains having a size less than the width of the copper-manganese alloy line. The bamboo-style segmentation between grain boundaries is substantially present through the copper-manganese alloy line as in the first exemplary metal interconnect structure. Thus, the bamboo microstructure eliminates copper diffusion along grain boundaries because any remaining grain boundaries are substantially perpendicular to the direction of current flow.

Figure 3:
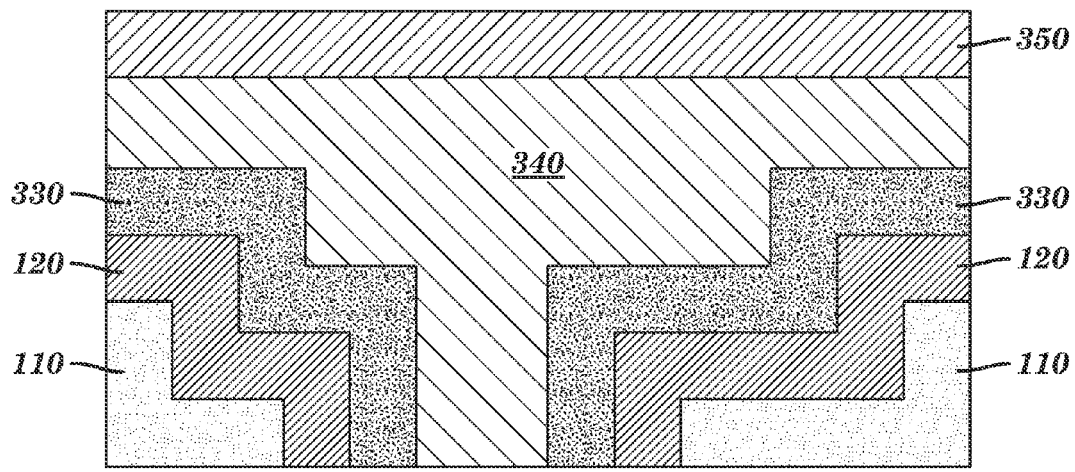
FIG. 3 illustrates a schematic cross section of a third embodiment of the metal interconnect structure of the present invention.
Figure 4A:
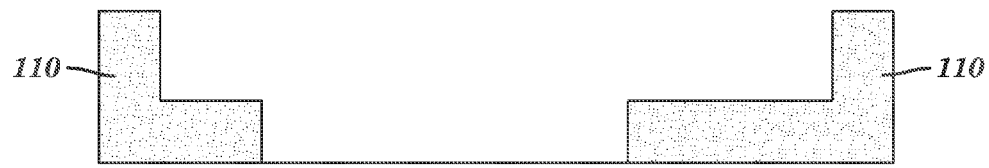
FIG. 4A-4E illustrates the method of manufacturing the metal interconnect structure of the present invention.
Figure 4B:
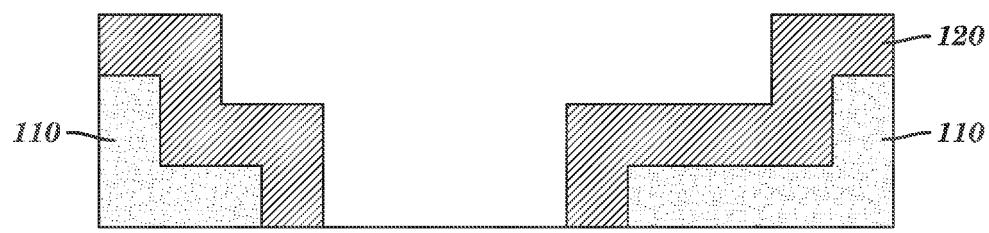
Figure 4C:
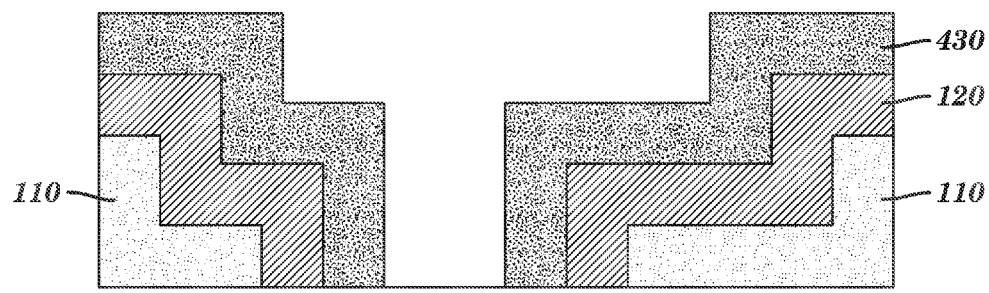
Figure 4D:
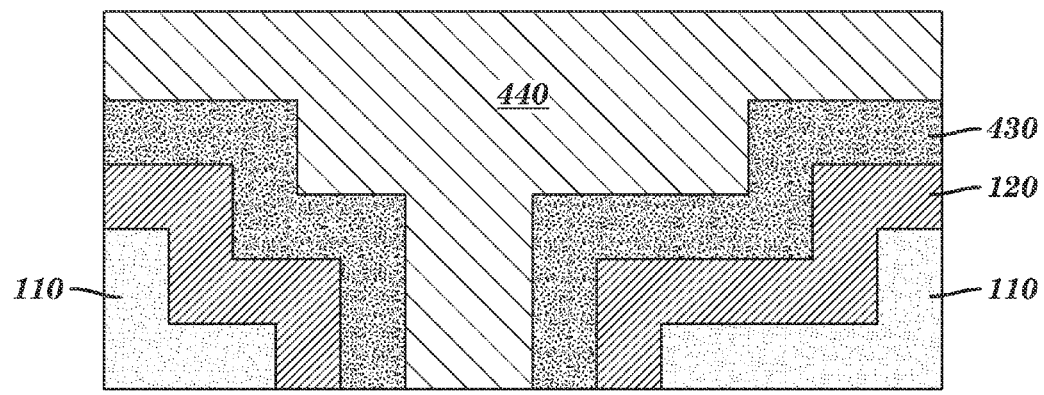
Figure 4E:
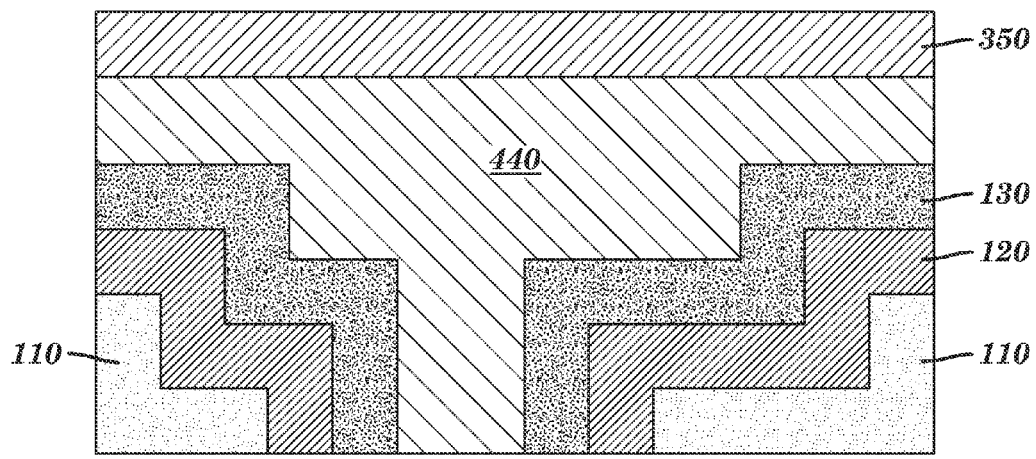

Referring to FIG. 3, a third exemplary metal interconnect structure according to a third embodiment of the present invention includes a dielectric layer 110, a metallic barrier layer 120, a copper-containing seed layer 330, plated copper-containing layer 340, and a copper-manganese alloy cap layer 350. The dielectric layer 110 is typically formed on a semiconductor substrate (not shown) containing semiconductor devices (not shown), and may include the same material as in the first embodiment. A via cavity and a line cavity is formed within the dielectric layer 110 by lithographic patterning and etching such that the via cavity overlaps with the line cavity in an integration scheme that is known in the art as a dual damascene integration scheme. The metallic barrier layer 120 is formed in the same manner as, and has the same composition and thickness as, in the first embodiment.

The copper-containing seed layer 330 is formed on the metallic barrier layer 120, for example, by physical vapor deposition (PVD), chemical vapor deposition (CVD), atomic layer deposition (ALD), electrodeposition, or electroless deposition. The copper-containing seed layer 330 may, or may not, include manganese. In one case, the copper-containing seed layer 330 may consist essentially of copper, so that any material other than copper in the copper-containing seed layer 330 is at a trace level. In another case, the copper-containing seed layer 330 may include a copper-manganese alloy with a manganese concentration from about 1 ppm to 10 atomic percent, and preferably from about 10 ppm to about 2 atomic percent. Incorporation of manganese into the copper-containing seed layer 330 may be effected, for example, by replacing pure copper in a sputtering target of a PVD process with a target containing a copper-manganese alloy. The copper-containing seed layer 330, as deposited, may have the same polycrystalline structure and thickness as in the first embodiment.

The plated copper-containing layer 340 is formed by plating a copper-containing material on the copper-containing seed layer 330. The plating process may employ electroplating or electroless plating. The plated copper-containing layer 340, due to the nature of the process employed for formation, that is, due to the nature of the plating process, includes O, N, C, Cl and S. The sum of concentrations of O, N, C, Cl and S is typically from about 1 ppm to about 200 ppm. Preferably, the plated copper-containing layer 340 is formed by electroplating. Typically, a superfill (bottom-up fill) process is employed to prevent formation of any seam within the via cavity or the line cavity so that the plated copper-containing layer 340 is free of any cavity therein.

The plated copper-containing layer 340 may, or may not, include manganese. In one case, the plated copper-containing layer 340 may consist essentially of copper, so that any material other than copper in the plated copper-containing layer 340 is at a trace level. In another case, the plated copper-containing layer 340 may include a copper-manganese alloy with a manganese concentration from about 1 ppm to 10 atomic percent, and preferably from about 10 ppm to about 2 atomic percent. Incorporation of manganese into the plated copper-containing layer 340 may be effected by replacing a plating bath containing a solution of pure copper with a plating bath containing a solution of copper-manganese alloy, that is, adding manganese to the plating bath so that manganese is incorporated into the film during plating. The microstructure and the thickness of the plated copper-containing layer 340 may be the same as in the first embodiment.

The copper-manganese alloy cap layer 350 includes an alloy of copper and manganese, and may consist of an alloy of copper and manganese. The concentration of manganese in the copper-manganese alloy cap layer 350 may be from about 1 ppm to about 50 atomic percent, and preferably from about 10 ppm to about 40 atomic percent, and more preferably from about 100 ppm to about 30 atomic percent. The copper-manganese alloy cap layer 350 may be formed, for example, by physical vapor deposition (PVD), chemical vapor deposition (CVD), atomic layer deposition (ALD), electrodeposition, or electroless deposition.

The thickness of the copper-manganese alloy cap layer 350 may be from about 1 nm to about 50 nm, and typically from about 3 nm to about 30 nm, although lesser and greater thicknesses are contemplated herein also. As deposited, the copper-manganese alloy cap layer 350 has a microstructure in which the grain size is from about 2 nm to about 20 nm, and typically from about 5 nm to about 10 nm, although grain size depends on the details of the deposition process and may be less than or greater than the range indicated above.

The third exemplary metal interconnect structure is subjected to a recrystallization process in which the grains grow in the copper-manganese alloy cap layer 350, the plated copper-containing layer 340, and the copper-containing seed layer 330. After the recrystallization process, the third exemplary metal interconnect structure is substantially the same as the first exemplary metal interconnect structure of FIG. 1 of the first embodiment. The copper-manganese alloy cap layer 350, the plated copper-containing layer 340, and the copper-containing seed layer 330 collectively become a copper-manganese alloy layer. The same kind of recrystallization process may be employed as in the first embodiment, and the grain size increases in the same manner as in the first embodiment. The manganese added into the copper-manganese alloy cap layer 350 affects the microstructure of a copper-manganese alloy layer after the recrystallization process. Manganese precipitates in the grain boundaries during the recrystallization process in the same manner as in the first embodiment. Manganese induces growth of large grains at the top interface with the copper-manganese cap layer 350 such that the size of the grains is substantially the same at the top of the copper-manganese cap alloy layer as at the bottom of the copper-manganese alloy layer.

Manganese present in the copper-manganese alloy cap layer 350 triggers grain growth during the recrystallization process. The grain growth extends into the plated copper-containing layer 340 and the copper-containing seed layer 330 so that the entirety of the copper-manganese alloy layer, which results from the copper-manganese alloy cap layer 350, the plated copper-containing layer 340, and the copper-containing seed layer 330, is affected by the grain growth. If the plated copper-containing layer 340 further includes manganese, the additional manganese in the copper-containing seed layer 330 may also promote the grain growth during the recrystallization process.

The third exemplary metal interconnect structure is substantially the same as the first exemplary metal interconnect structure as shown in FIG. 1, and accordingly, the same physical, compositional, and structural characteristics. The copper-manganese alloy layer is planarized in the same manner as in the first embodiment to form a copper-manganese alloy line. The third exemplary metal interconnect structure at this point is substantially the same as the first exemplary metal interconnect structure in FIG. 1. The third exemplary metal interconnect structure includes the copper-manganese alloy line, which has a substantially bamboo microstructure, and is substantially free of small grains having a size less than the width of the copper-manganese alloy line. The bamboo-style segmentation between grain boundaries is substantially present through the copper-manganese alloy line as in the first exemplary metal interconnect structure. Thus, the bamboo microstructure eliminates copper diffusion along grain boundaries because any remaining grain boundaries are substantially perpendicular to the direction of current flow. A bamboo grain every "Blech" length substantially stops electromigration induced by grain boundary diffusion.

Referring to FIGS. 4A-4E, a method of forming the metal interconnect structures described above is shown. A dielectric material 110 is provided on a pre-existing semiconductor structure (not shown). The dielectric material 110 has been etched to form a recessed line pattern in the dielectric material 110. A metallic barrier layer 120 is formed on the dielectric material 110. Preferably, the metallic barrier layer 120 is formed along a top portion and sidewalls of the recessed line pattern in dielectric material 110. A copper-containing seed layer 430 is formed on the metallic barrier layer, preferably on a top portion and on sidewalls of the recessed line pattern on the dielectric material 110. A copper-containing layer 440 is deposited and electroplated on the copper-containing seed layer 430. At least one of the copper-containing seed layer 430 and copper-containing layer 440 includes a copper-manganese alloy. The copper-manganese alloy contains a manganese concentration from about 1 ppm to about 10 atomic percent. Preferably, the copper-manganese alloy contains a manganese concentration from about 10 ppm to about 2 atomic percent. A copper-manganese alloy cap layer 350 may also be formed on the copper-containing layer 440. The copper-manganese alloy cap layer 350 preferably has a manganese concentration from about 1 ppm to about 50 atomic percent.

The copper-containing seed layer 430 and the copper-containing layer 440 are annealed at a temperature from about 20° C. to about 400° C. for a time period from about 1 second to about 1 week. During the annealing process, the grain size increases in the copper-containing layer 440 and the copper-containing seed layer 430. The increase in grain size also decreases resistance within the copper-containing seed layer 430 and the copper-containing layer 440. The copper-containing seed layer 430 and copper-containing layer 440 substantially form a bamboo microstructure within the recessed line pattern. Grain boundaries within the bamboo microstructure extend to a bottom surface of the copper-containing layer 440 at least every "Blech" length. Some of the manganese (Mn) will diffuse to the surfaces of the recessed line pattern and react with any available oxygen ($O_2$) forming a manganese oxide (MnO) or manganese silicate (MnSiO) layer, thus removing the manganese alloy from the copper (Cu). The grain size may be increased in such a way that grain boundaries are separated from one another by at least a width of a metal line at a bottom surface of the metal line.

Figure 5:
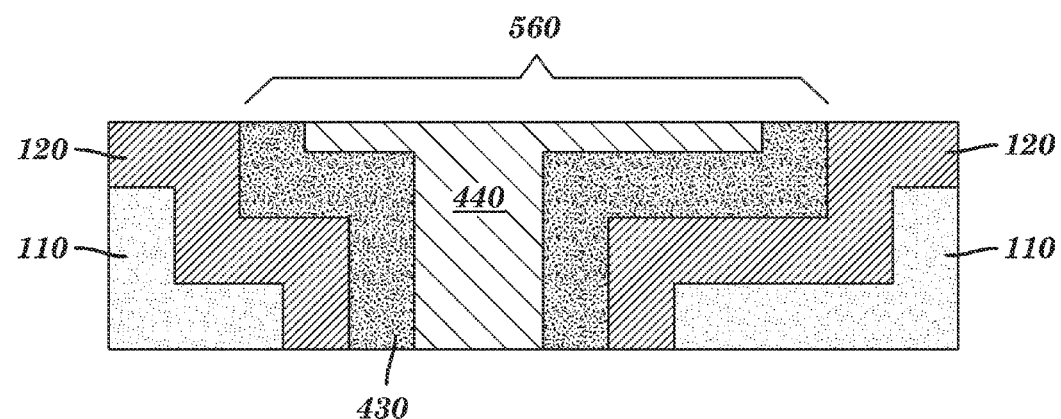
FIG. 5 illustrates a schematic cross section of a fourth embodiment of the metal interconnect structure of the present invention.

As shown in FIG. 5, the copper-containing layer 440 is planarized, stopping at the top of the dielectric layer. A remaining portion of the copper-containing seed layer 430 and the copper-containing layer 440 constitutes a copper-manganese alloy line. The grain size measured at a bottom of the copper-manganese alloy line can exceed a width of the copper-manganese alloy line. The copper-manganese alloy line substantially has a bamboo microstructure where each grain boundary extends from a top surface of the copper-manganese alloy line to a bottom surface of the copper-manganese alloy line and is separated from any other grain boundary by a distance greater than the width of the copper-manganese alloy line.

Figure 6:
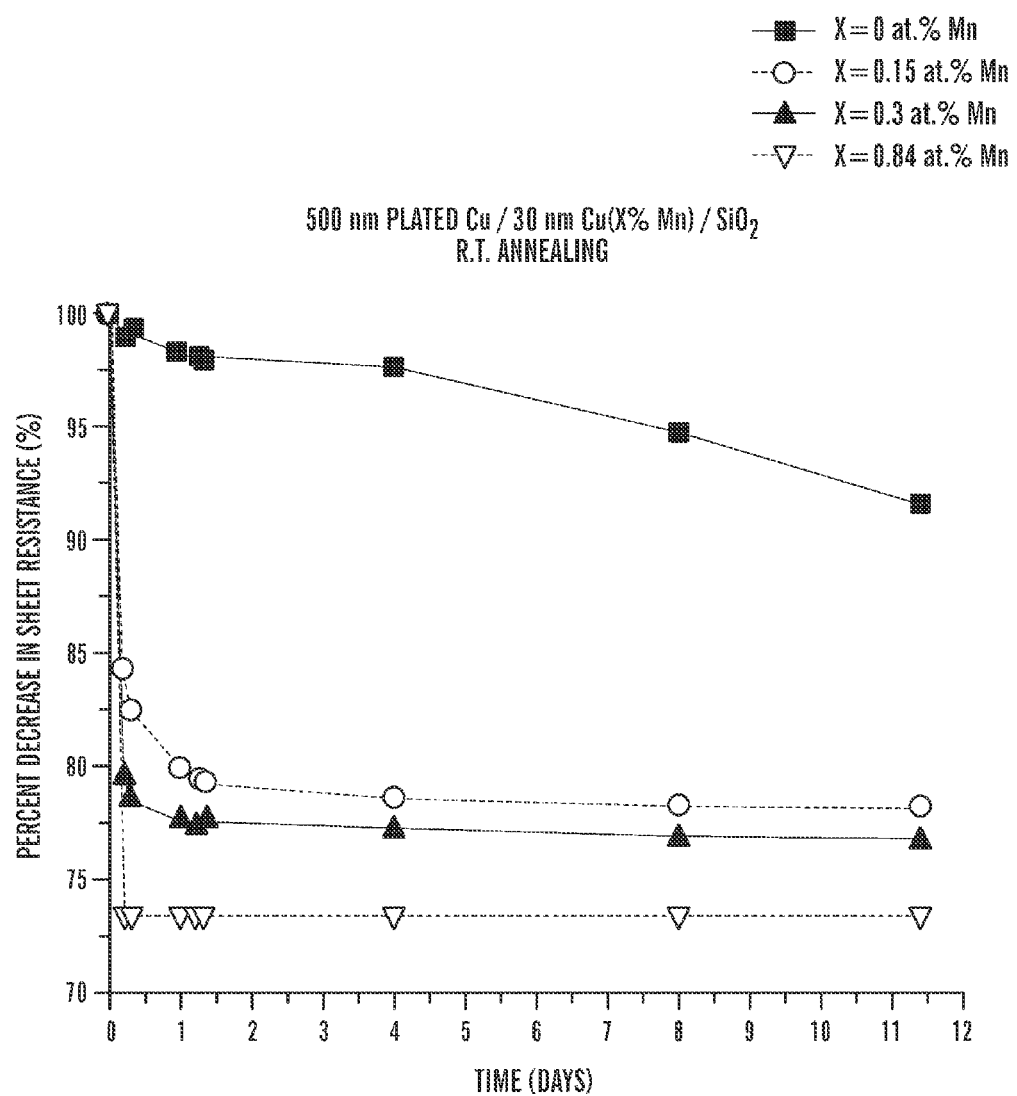
FIG. 6 illustrates a plot of percentage decrease in sheet resistance versus time at room temperature for a 500 nm plated copper film on a 30 nm Cu—Mn seed layer on silicon oxide.

FIG. 6 shows a plot of percentage decrease in sheet resistance versus time at room temperature for a 500 nm plated copper film on a 30 nm Cu—Mn seed layer on a silicon oxide. The percentage of Mn in the copper seed layer ranges from 0.15 to 0.84 atomic percent Mn. It is clear that the plated Cu sheet resistance drops much quicker on the Cu—Mn seed layers with 0.84 atomic percent Mn showing fastest drop, complete within 5 hrs. The sheet resistance is a measure of the room temperature Cu grain growth (recrystallization), which is well known for plated Cu films. The Mn enhances the recrystallization. After 11.5 days, the pure Cu seed layer shows a sheet resistance drop of only approximately 8%, whereas on the Cu—Mn seed layers recrystallization is complete after approximately 1.5 days.

Figure 7:
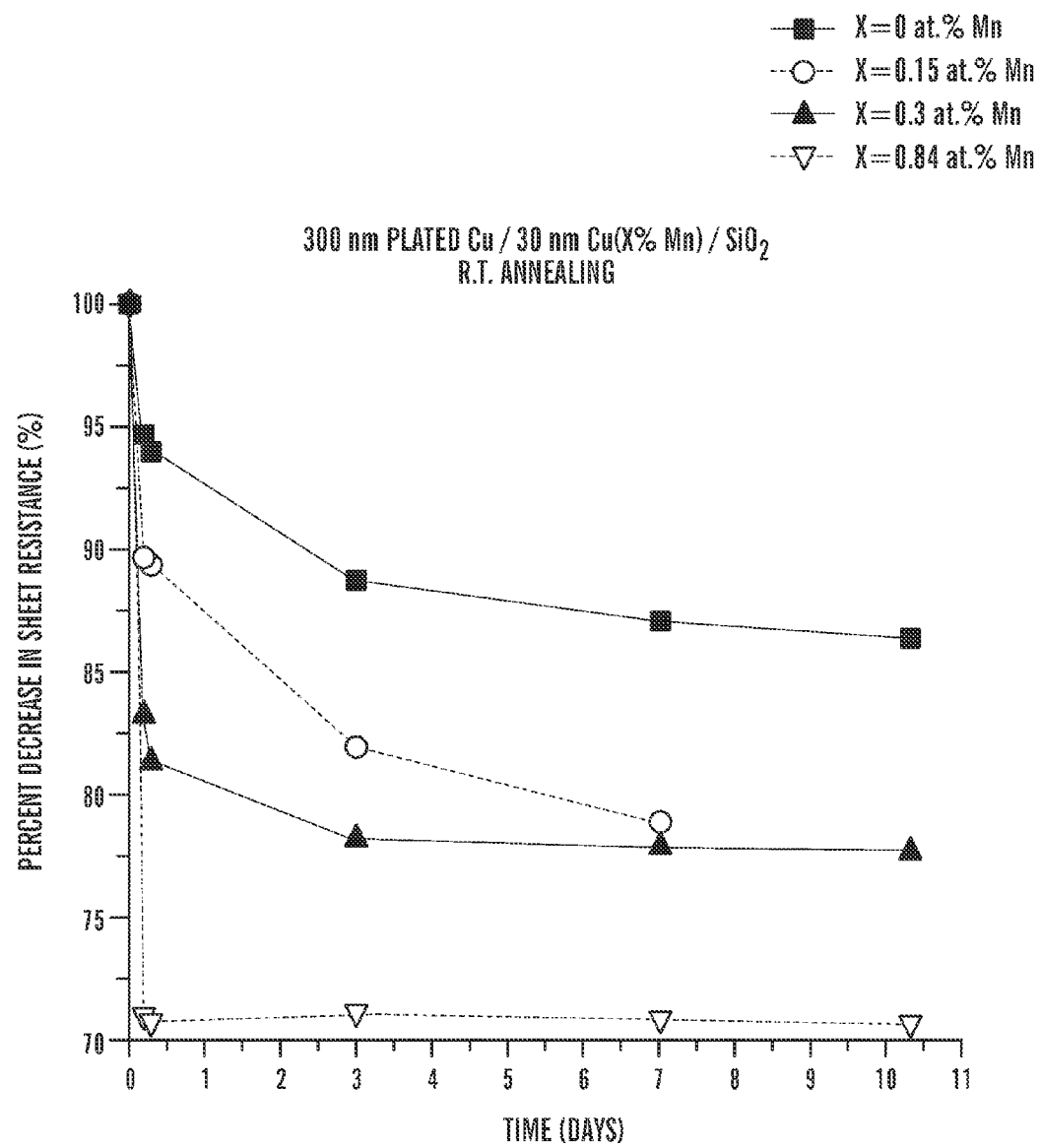
FIG. 7 illustrates a plot of percentage decrease in sheet resistance versus time at room temperature for a 300 nm plated copper film on a 30 nm Cu—Mn seed layer on silicon oxide.

FIG. 7 similarly illustrates a percentage decrease in sheet resistance versus time at room temperature for a plated copper film on a Cu—Mn seed layer on a silicon oxide. In FIG. 7, the thickness of the plated Cu film is 300 nm thick. Again, the Cu—Mn seed layers enhance the Cu recrystallization, with the 0.84 atomic percent Mn showing the fastest recrystallization rate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A metal interconnect structure, comprising:
   a dielectric material layer containing a recessed line pattern;

a metallic barrier layer abutting the dielectric material layer at sidewalls of the recessed line pattern and overlying an entirety of the dielectric material layer;

a copper-containing seed layer abutting the metallic barrier layer and overlying an entirety of the dielectric material layer; and a copper-containing layer comprising electroplated copper and abutting the copper-containing seed layer, wherein at least one of the copper-containing seed layer and the copper-containing layer comprises a copper-manganese alloy, and wherein the copper-containing seed layer and the copper-containing layer form a bamboo grain within the recessed line pattern, the grain size measured at a bottom surface of the copper-containing layer exceeding a width of the copper-manganese alloy line at least every "Blech" length.

2. The structure of claim 1, wherein the copper-containing layer comprises O, N, C, Cl and S, a sum of concentrations of which ranges from about 1 ppm to about 200 ppm.

3. The structure of claim 1, wherein at least one of the copper-containing seed layer and the copper-containing layer contains a manganese concentration from about 1 ppm to about 10 atomic percent.

4. The structure of claim 1, wherein the copper-manganese alloy contains a manganese concentration from about 10 ppm to about 2 atomic percent.

5. The structure of claim 1, wherein the copper-containing seed layer comprises a copper-manganese alloy containing a manganese concentration from about 1 ppm to about 10 atomic percent and has a thickness from about 2 nm to about 60 nm.

6. The structure of claim 1, wherein the copper-containing layer comprises a copper-manganese alloy containing a manganese concentration from about 1 ppm to about 10 atomic percent and has a thickness from about 40 nm to about 800 nm above a portion of the dielectric material layer located outside the recessed line pattern.

7. A metal interconnect structure, comprising:
a dielectric material layer containing a recessed line pattern;

a metallic barrier layer abutting the dielectric material layer at sidewalls of the recessed line pattern and overlying an entirety of the dielectric material layer;

a copper-containing seed layer abutting the metallic barrier layer and overlying an entirety of the dielectric material layer;

a copper-containing layer comprising electroplated copper and abutting the copper-containing seed layer, wherein the copper-containing seed layer and the copper-containing layer form a bamboo grain within the recessed line pattern, the grain size measured at a bottom surface of the copper-containing layer exceeding a width of the copper-manganese alloy line at least every "Blech" length; and a copper-manganese alloy cap layer abutting the copper-containing layer.

8. The structure of claim 7, wherein the copper-containing layer comprises O, N, C, Cl, and S, a sum of concentrations of which is from about 1 ppm to about 200 ppm.

9. The structure of claim 8, wherein the copper-manganese alloy contains a manganese concentration from about 10 ppm to about 20 atomic percent.

10. The structure of claim 7, wherein the copper-manganese alloy cap layer contains a manganese concentration from about 1 ppm to about 50 atomic percent.

* * * * *